(12) United States Patent
Rim et al.

(10) Patent No.: US 8,134,217 B2
(45) Date of Patent: Mar. 13, 2012

(54) BYPASS DIODE FOR A SOLAR CELL

(75) Inventors: Seung Bum Rim, Palo Alto, CA (US); Taeseok Kim, San Jose, CA (US); David D. Smith, Campbell, CA (US); Peter J. Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 12/967,976

(22) Filed: Dec. 14, 2010

(65) Prior Publication Data

US 2011/0284986 A1 Nov. 24, 2011

(51) Int. Cl.
H01L 21/02 (2006.01)

(52) U.S. Cl. ........ 257/431; 257/433; 257/461; 257/465; 257/E21.149; 257/E21.237; 257/E31.001; 257/E31.063

(58) Field of Classification Search .......... 257/431–433, 257/461–465, E21.149, 237, 31.001, 63
See application file for complete search history.

(56) References Cited

U.S. PATENT DOCUMENTS

| | | | | |
|---|---|---|---|---|
| 5,665,175 A * | 9/1997 | Safir | .............................. | 136/255 |
| 6,313,396 B1 * | 11/2001 | Glenn | ............................ | 136/244 |
| 6,452,086 B1 * | 9/2002 | Muller | ........................... | 136/244 |
| 6,635,507 B1 | 10/2003 | Boutros et al. | | |
| 7,812,250 B2 | 10/2010 | Smith | | |
| 2005/0072457 A1 * | 4/2005 | Glenn | .......................... | 136/246 |
| 2007/0089779 A1 * | 4/2007 | Balasubramanian et al. | | 136/252 |
| 2007/0113884 A1 * | 5/2007 | Kinsey et al. | .................. | 136/252 |
| 2008/0000523 A1 * | 1/2008 | Hilgarth et al. | ............... | 136/255 |
| 2008/0035198 A1 | 2/2008 | Teppe et al. | | |
| 2008/0128014 A1 * | 6/2008 | Van Riesen et al. | .......... | 136/244 |
| 2009/0308438 A1 | 12/2009 | De Ceuster et al. | | |
| 2010/0132759 A1 * | 6/2010 | Jia et al. | ......................... | 136/244 |
| 2011/0000528 A1 * | 1/2011 | Garvan et al. | .................. | 136/252 |
| 2011/0030759 A1 * | 2/2011 | Funakoshi | ..................... | 136/244 |
| 2011/0100414 A1 * | 5/2011 | Moon et al. | ................... | 136/244 |
| 2011/0265857 A1 * | 11/2011 | Wang et al. | .................... | 136/249 |

OTHER PUBLICATIONS

De Ceuster, Denis et al., U.S. Appl. No. 12/945,555 entitled "Trench Process and Structure for Backside Contact Solar Cells with Polysilicon Doped Regions," filed Nov. 12, 2010, 51 pgs.
Smith, David D., U.S. Appl. No. 12/879,847 entitled "Trench Process and Structure for Backside Contact Solar Cells with Polysilicon Doped Regions," filed Apr. 28, 2009, 25 pgs.

* cited by examiner

*Primary Examiner* — Michael Lebentritt
(74) *Attorney, Agent, or Firm* — Blakely Sokoloff Taylor & Zafman LLP

(57) ABSTRACT

Bypass diodes for solar cells are described. In one embodiment, a bypass diode for a solar cell includes a substrate of the solar cell. A first conductive region is disposed above the substrate, the first conductive region of a first conductivity type. A second conductive region is disposed on the first conductive region, the second conductive region of a second conductivity type opposite the first conductivity type.

18 Claims, 10 Drawing Sheets

916

910

902

918

US 8,134,217 B2

BYPASS DIODE FOR A SOLAR CELL

The invention described herein was made with Governmental support under contract number DE-FC36-07GO17043 awarded by the United States Department of Energy. The Government may have certain rights in the invention.

TECHNICAL FIELD

Embodiments of the present invention are in the field of renewable energy and, in particular, bypass diodes for solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

Figure 1:
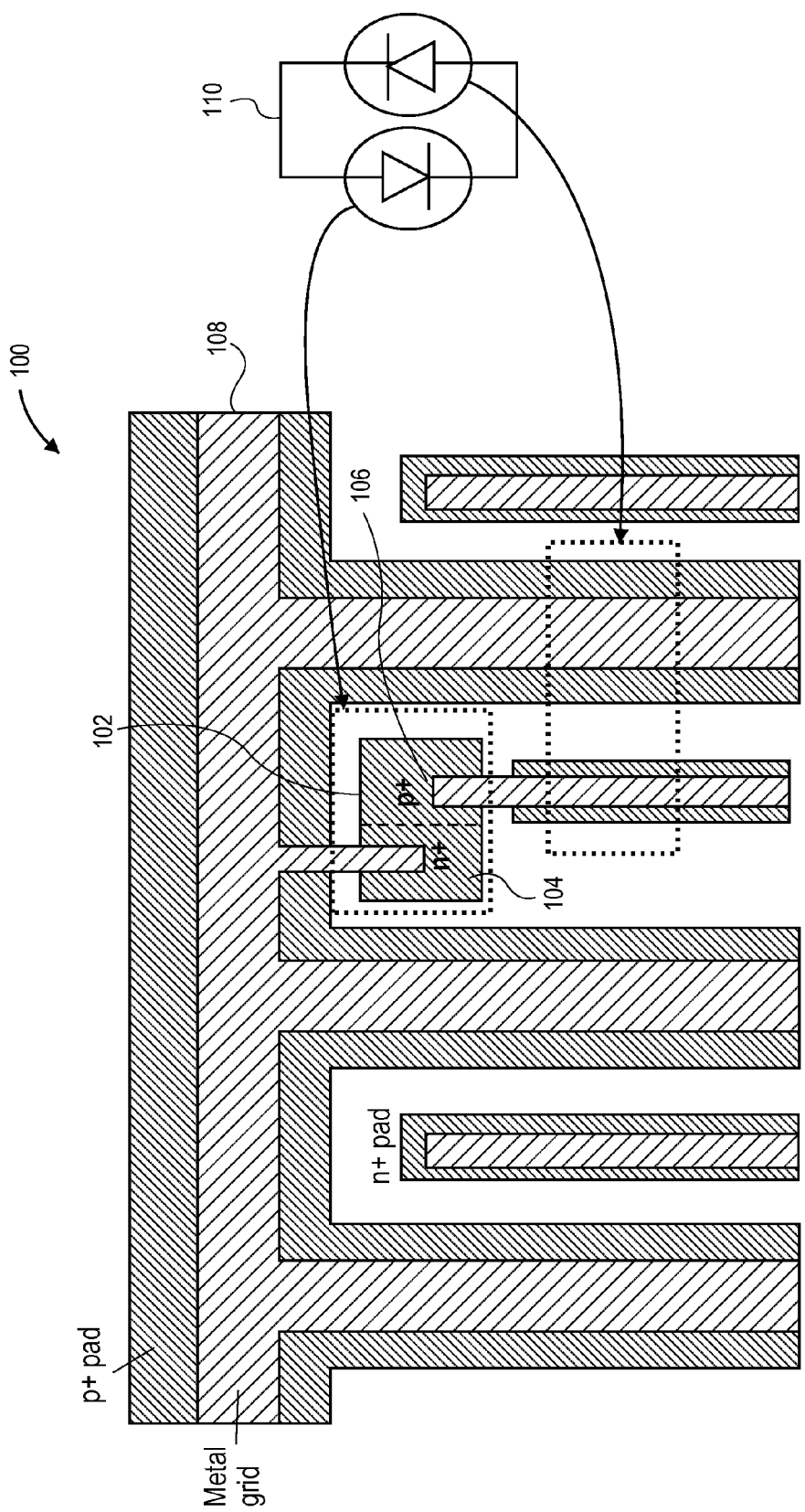
FIG. 1 illustrates a top-down plan view of a monolithic bypass diode for a solar cell, in accordance with an embodiment of the present invention.

Bypass diodes for solar cells are described herein. In the following description, numerous specific details are set forth, such as specific diode structures and process flow operations, in order to provide a thorough understanding of embodiments of the present invention. It will be apparent to one skilled in the art that embodiments of the present invention may be practiced without these specific details. In other instances, well-known fabrication techniques, such as metal contact formation techniques, are not described in detail in order to not unnecessarily obscure embodiments of the present invention. Furthermore, it is to be understood that the various embodiments shown in the figures are illustrative representations and are not necessarily drawn to scale.

Disclosed herein are bypass diodes for solar cells. In one embodiment, a bypass diode for a solar cell includes a substrate of the solar cell. The bypass diode also includes a first conductive region disposed above the substrate, the first conductive region of a first conductivity type. The bypass diode also includes a second conductive region disposed on the first conductive region, the second conductive region of a second conductivity type opposite the first conductivity type.

Also disclosed herein are methods of fabricating bypass diodes for solar cells. In one embodiment, a method of fabricating a bypass diode for a solar cell includes forming a first conductive region on a substrate of the solar cell, the first conductive region of a first conductivity type. The method also includes forming a second conductive region within, and surrounded by, an uppermost portion of the first conductive region but not in a lowermost portion of the first conductive region, the second conductive region of a second conductivity type opposite the first conductivity type. In another embodiment, a method of fabricating a bypass diode for a solar cell includes forming a first conductive region on a substrate of the solar cell, the first conductive region of a first conductivity type. The method also includes printing a second conductive region on the first conductive region, the second conductive region of a second conductivity type opposite the first conductivity type, and the second conductive region printed narrower than the first conductive region to retain an exposed top surface of the first conductive region.

Solar cells are typically heated when reversely biased by shading or soiling. Bypass diodes may be used to protect solar cells from breakdown during such events. However, power may be lost since bypass diodes are attached on a per-string basis (e.g., 12-18 cells) and the protection is not perfect if hot spots are present. Thus, it may be desirable to provide bypass diode protection of individual cells.

In accordance with an embodiment of the present invention, built-in bypass diode protection is provided to protect each solar cell on an individual basis. The protection is for reverse bias events as well as for temperature suppression of hot spots. In one embodiment, a vertical PN junction polysilicon diode is fabricated by doping a portion of a polysilicon emitter using a laser process. In another embodiment, a vertical PN junction polysilicon diode is fabricated by depositing a doped amorphous silicon or nano-crystalline silicon layer on top of a polysilicon emitter. In either case, the fabricated diode functions as a bypass diode for a solar cell and reduces the temperature of hot spots. In a specific embodiment, as few process operations as possible are applied to provide built-in bypass diodes. Furthermore, the diodes may sacrifice only a small area of corresponding solar cells since the junction is a vertical junction as opposed to a lateral junction. In an embodiment, the diodes are useful for both regular panels as well as concentrator solar cells.

FIG. 1 illustrates a top-down plan view of a monolithic bypass diode for a solar cell, in accordance with an embodiment of the present invention. Referring to FIG. 1, a portion 100 of a solar cell includes a polysilicon bypass diode 102 with an N+ region 104 and a P+ region 106. A metal grid 108 makes contact to both regions 104 and 106. As depicted by a diode schematic 110, bypass diode 102 is shunted to its corresponding solar cell.

In an embodiment, bypass diode 102 is isolated by a trench laterally and by a P+/n-Si base junction vertically. In an embodiment, P+ polysilicon is at the bottom of the bypass diode 102 and is isolated with other P fingers. In an embodiment, the area consumed by bypass diode 102 cannot be used for power generation and is thus fabricated to be small relative to the total area of the solar cell. In an embodiment, bypass diode 102 provides higher current in reverse bias to reduce power consumption. Trench isolation may be achieved by a technique described in U.S. Pat. No. 7,812,250 and U.S. patent publication 2009/0308438, both assigned to SunPower Corporation of San Jose, Calif., USA.

Figure 2:
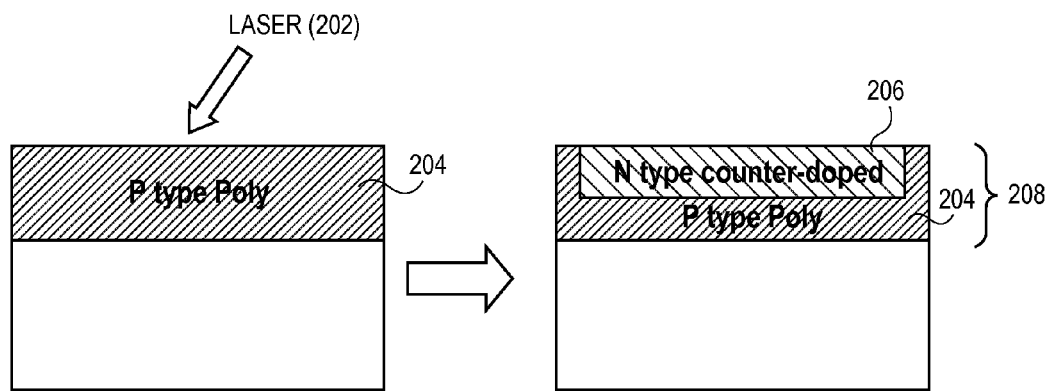
FIG. 2 is a schematic illustrating a process using a laser to dope a portion of a P-type emitter region to convert the portion into an N-type region to form a bypass diode for a solar cell, in accordance with an embodiment of the present invention.

In an aspect of the present invention, a laser doping process may be used to fabricate a bypass diode for a solar cell. For example, FIG. 2 is a schematic illustrating a process using a laser to dope a portion of a P-type emitter region to convert the portion into an N-type region to form a bypass diode for a solar cell, in accordance with an embodiment of the present invention. Referring to FIG. 2 a laser 202 is used to dope a portion of a P-type polysilicon emitter region 204 to convert into N-type polysilicon 206. The laser doping approach provides a vertical PN junction polysilicon diode 208. The incorporation of such a diode with a solar cell may enable bypass protection of cells in reverse bias. In a specific embodiment, laser doping is used to counter dope P-type polysilicon into N-type polysilicon using phosphosilicate glass (PSG) or POCl$_3$ as a precursor film or using a gas immersion laser doping process. In another specific embodiment, laser doping is used to counter dope P-type polysilicon into N-type polysilicon using a phosphorous doped oxide film grown in previous process operations such as annealing or dopant drive process operations with POCl$_3$ or phosphoric gas. In another specific embodiment, laser doping is used to counter dope P-type polysilicon into N-type polysilicon using a water-jet laser doping process with a liquid precursor.

Figure 3:
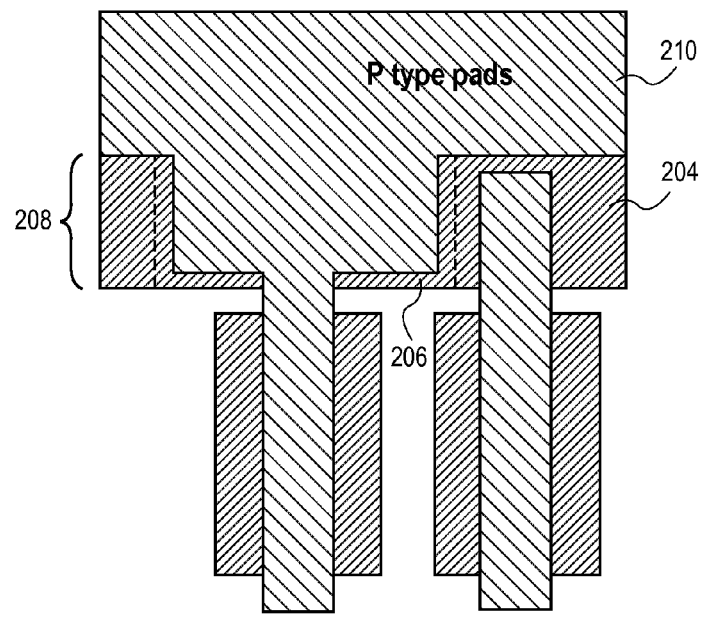
FIG. 3 illustrates a top-down plan view of a bypass diode including the P-type and N-type regions of FIG. 2, in accordance with an embodiment of the present invention.

FIG. 3 illustrates a top-down plan view of a bypass diode including the P-type and N-type regions of FIG. 2, in accordance with an embodiment of the present invention. Referring to FIG. 3, the N-type polysilicon 206 is contacted with a P-type pad 210. Contact is also made to the P-type portion of the polysilicon diode 208 to provide interconnection of the built-in bypass diode 208 shunted to solar cells. The spatial area of such a bypass diode can be adjusted depending on the amount of current protect is sought for, as well a selected sacrifice in forward bias.

Figure 4:
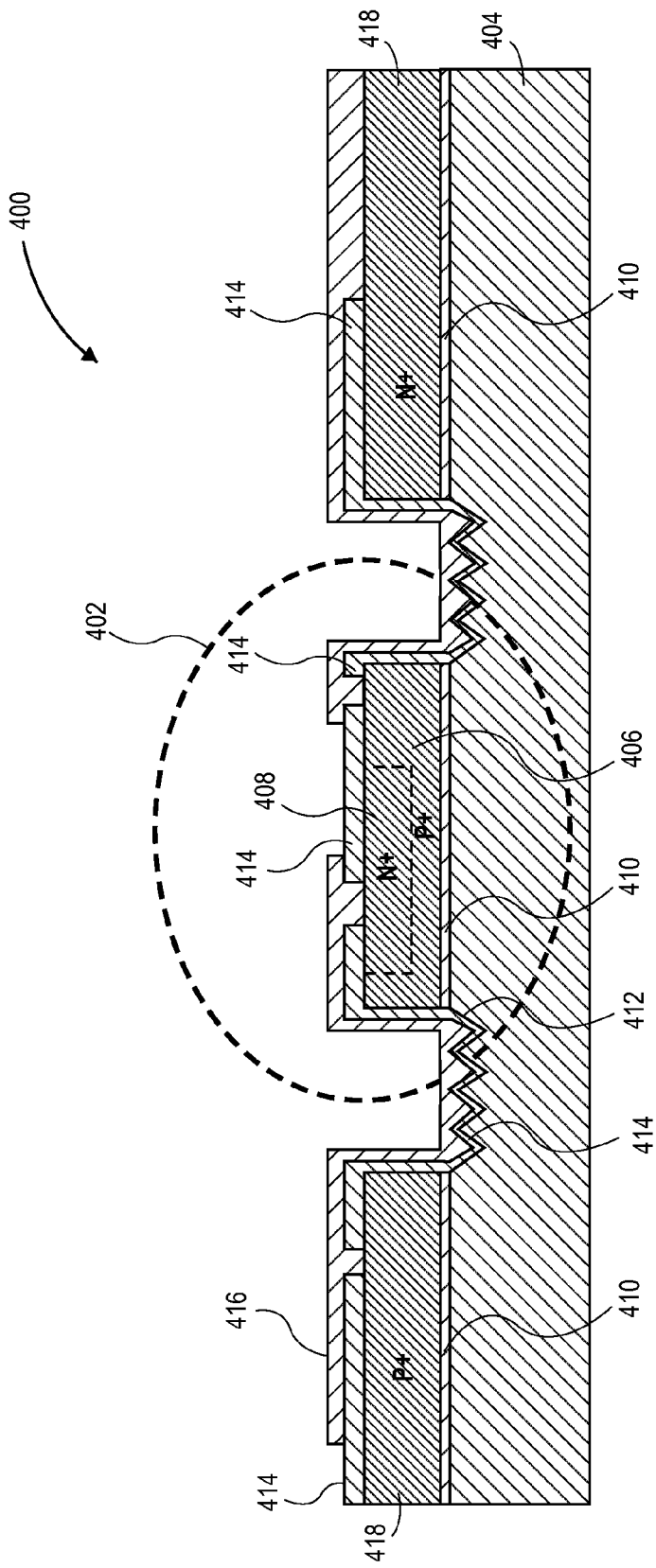
FIG. 4 illustrates a cross-sectional view of a bypass diode formed by laser doping, in accordance with an embodiment of the present invention.

FIG. 4 illustrates a cross-sectional view of a bypass diode formed by laser doping, in accordance with an embodiment of the present invention. The vertical N+/P+ bypass diode (located in the hashed circle 402 of FIG. 4) may be fabricated by counter-doping P+ polysilicon into N+ polysilicon using a laser process, as described above.

Referring to FIG. 4, a bypass diode 402 for a solar cell 400 includes a substrate 404 of the solar cell 400. A first conductive region 406 of a first conductivity type is disposed above the substrate 404. A second conductive region 408 is disposed on the first conductive region 406. The second conductive region 408 is of a second conductivity type opposite the first conductivity type. In an embodiment, the second conductive region 408 is disposed within, and surrounded by, an uppermost portion of the first conductive region 406, but is not disposed in a lowermost portion of the first conductive region 406, as depicted in FIG. 4.

In one embodiment, the substrate 404 is doped with N-type dopant impurity atoms, the first conductivity type is P-type, the second conductivity type is N-type, and the second conductive region 408 is disposed within and surrounded by a P-type region, as described above in association with FIGS. 2 and 3 and as depicted in FIG. 4. However, in an alternative embodiment, the substrate 404 is doped with P-type dopant impurity atoms, the first conductivity type is N-type, the second conductivity type is P-type, and the second conductive region 408 is disposed within and surrounded by a N-type region.

In an embodiment, the bypass diode 402 further includes a thin dielectric layer 410 disposed on the substrate 404. The first conductive region 406 is disposed on the thin dielectric layer 410, as depicted in FIG. 4. In one embodiment, the thin dielectric layer 410 is a silicon oxide layer having a thickness approximately in the range of 5-50 Angstroms. In an embodiment, the bypass diode 402 further includes an isolation trench 412 disposed in the substrate 404 and surrounding the portion of the substrate 404 below the first conductive region 406. In one embodiment, the isolation trench 412 is filled with a dielectric layer 414, such as an anti-reflective coating layer, that is disposed on the first and second conductive regions 406 and 408, respectively, as depicted in FIG. 4. In a specific embodiment, the bottom surface of the isolation trench 412 has a random or regularized texturing pattern, as is also depicted in FIG. 4. The random or regularized texturing pattern may be formed by applying an anisotropic etching process to exposed regions of substrate 404 and may thus be determined by crystal planes of the substrate 404. Bypass diode 402 and, hence, solar cell 400 may include other features such a metal contact layer 416. Solar cell 400 may also include features suitable for back contact formation, such as back contacts 418.

Figure 5:
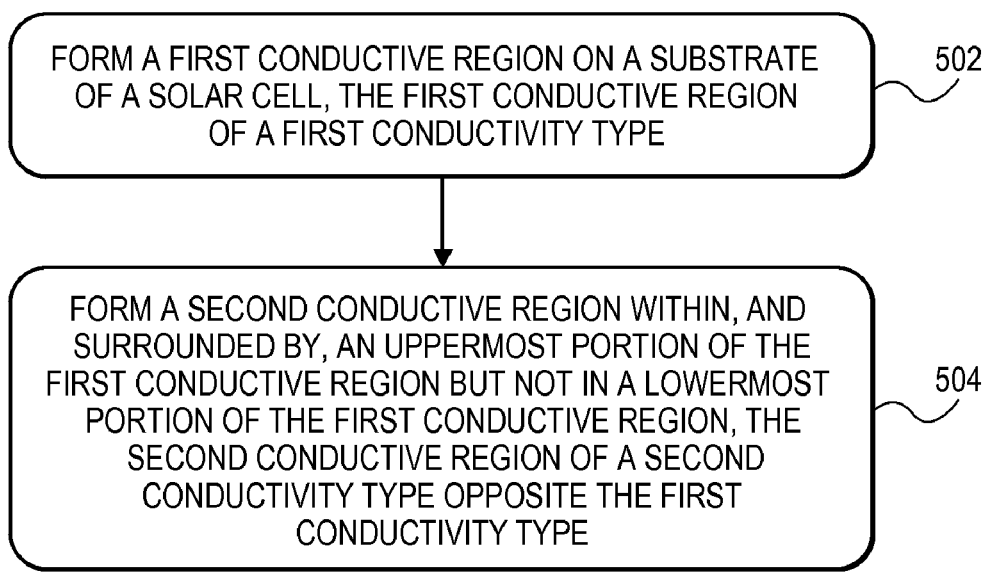
FIG. 5 illustrates a flowchart representing operations in a method of fabricating a bypass diode for a solar cell, in accordance with an embodiment of the present invention.

FIG. 5 illustrates a flowchart 500 representing operations in a method of fabricating a bypass diode for a solar cell, in accordance with an embodiment of the present invention.

FIGS. 6A-6F illustrate cross-sectional views of various stages in the fabrication of a solar cell, corresponding to operations of the flowchart of FIG. 5, in accordance with an embodiment of the present invention.

Figure 6A:
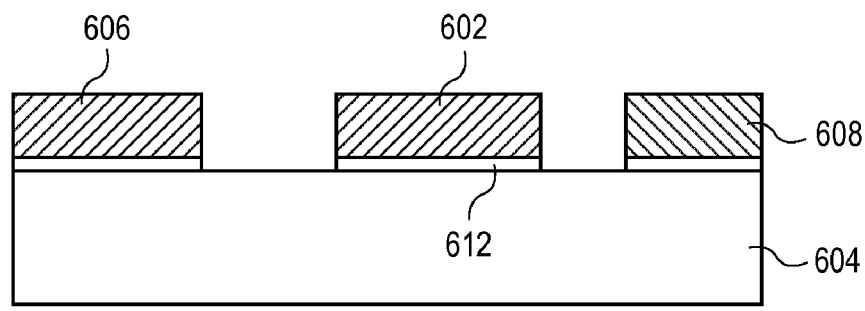
FIG. 6A illustrates a cross-sectional view of a stage in the fabrication of a solar cell, corresponding to operation 502 of the flowchart of FIG. 5, in accordance with an embodiment of the present invention.

Referring to operation 502 of flowchart 500, and to corresponding FIG. 6A, a method of fabricating a bypass diode for a solar cell includes forming a first conductive region 602 on a substrate 604 of the solar cell. In an embodiment, the first conductive region 602 is of a first conductivity type. In an embodiment, forming the first conductive region 602 includes using a material such as, but not limited to, a doped polycrystalline layer including polysilicon, doped nano-particles, a doped amorphous film, or a conductive polymer. As is also depicted in FIG. 6A, other conductive regions, such as regions for back-contact, may also be formed. For example, a region 606 has the first conductivity type, while a region 608 has a second, opposite conductivity type.

Figure 6B:
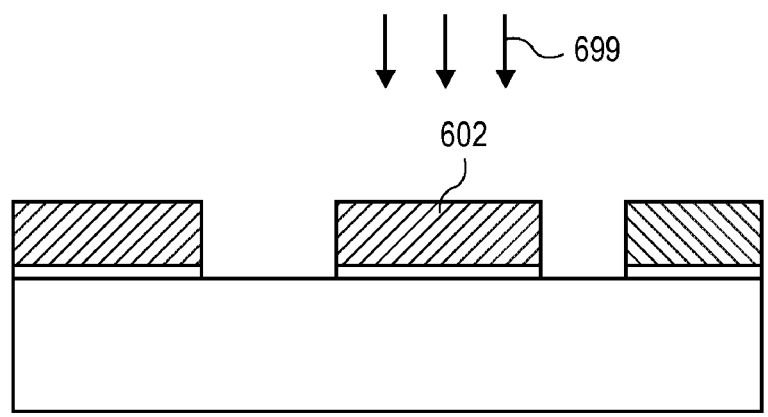
FIG. 6B illustrates a cross-sectional view of a stage in the fabrication of a solar cell, corresponding to operation 504 of the flowchart of FIG. 5, in accordance with an embodiment of the present invention.
Figure 6C:
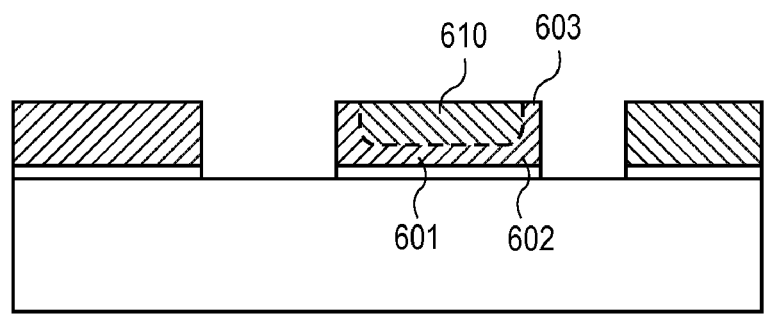
FIG. 6C illustrates a cross-sectional view of a stage in the fabrication of a solar cell, corresponding to operation 504 of the flowchart of FIG. 5, in accordance with an embodiment of the present invention.

Referring to operation 504 of flowchart 500, and to corresponding FIGS. 6B and 6C, the method of fabricating the bypass diode for the solar cell also includes forming a second conductive region 610 within, and surrounded by, an uppermost portion of the first conductive region but not in a lowermost portion 601 of the first conductive region. In an embodiment, the second conductive region 610 is of a second conductivity type opposite the first conductivity type. In one embodiment, forming the second conductive region 610 includes using a laser doping process 699, as described above. In a specific embodiment, the substrate 604 is doped with N-type dopant impurity atoms, the first conductivity type is P-type, and the second conductivity type is N-type. However, in an alternative embodiment, the substrate 604 is doped with P-type dopant impurity atoms, the first conductivity type is N-type, and the second conductivity type is P-type.

In an embodiment, referring again to FIG. 6A, the method further includes, prior to forming the first conductive region 602, forming a thin dielectric layer 612 on the substrate, wherein the first conductive region 602 is formed on the thin dielectric layer 612. In one embodiment, the thin dielectric layer 612 is a silicon oxide layer having a thickness approximately in the range of 5-50 Angstroms.

Figure 6D:
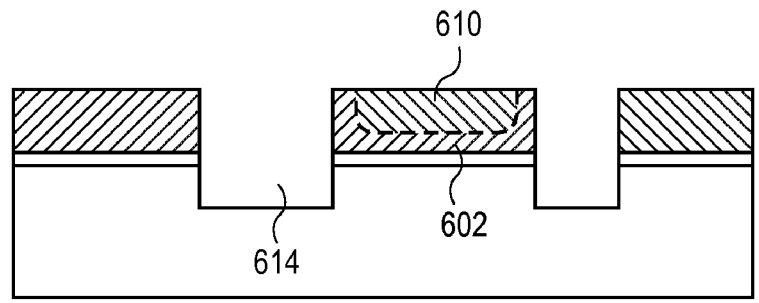
FIG. 6D illustrates a cross-sectional view of a stage in the fabrication of a solar cell, in accordance with an embodiment of the present invention.
Figure 6E:
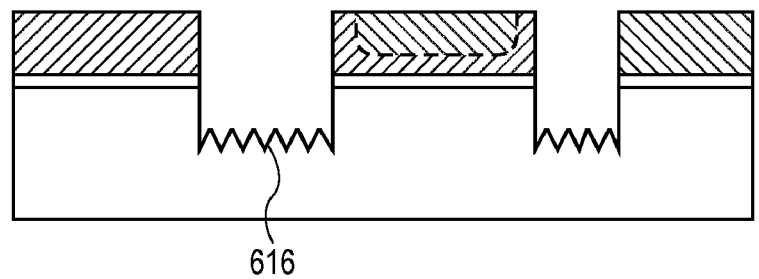
FIG. 6E illustrates a cross-sectional view of a stage in the fabrication of a solar cell, in accordance with an embodiment of the present invention.
Figure 6F:
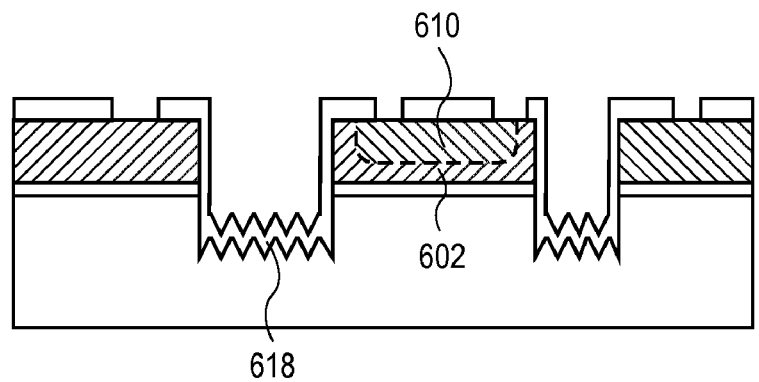
FIG. 6F illustrates a cross-sectional view of a stage in the fabrication of a solar cell, in accordance with an embodiment of the present invention.

In an embodiment, referring to FIG. 6D, the method of fabricating the bypass diode for the solar cell also includes forming an isolation trench 614 in the substrate 604 and surrounding the portion of the substrate 604 below the first conductive region 602. In one embodiment, the method also includes forming a dielectric layer 618 in the isolation trench 614 and on at least a portion of each of the first and second conductive regions 602 and 610, respectively. In a specific embodiment, openings are formed in the dielectric layer 618 for subsequent contact formation, as depicted in FIG. 6F. In another specific embodiment, the method further includes, prior to forming the dielectric layer 618, etching the bottom surface of the isolation trench 614 to provide a random or regularized texturing pattern 616, as depicted in FIG. 6E.

It is to be understood that the process described in association with FIGS. 6A-6F may be performed in sequences other than the specific sequence described above. For example, in an embodiment, the second conductive region 610 (as shown being formed in FIGS. 6B and 6C) is formed subsequent to forming the isolation trench 614 (as shown being formed in FIG. 6D) and subsequent to forming the random or regularized texturing pattern 616 (as shown being formed in FIG. 6E). In another embodiment, the second conductive region 610 (as shown being formed in FIGS. 6B and 6C) is formed subsequent to forming the isolation trench 614 (as shown being formed in FIG. 6D), but prior to forming the random or regularized texturing pattern 616 (as shown being formed in FIG. 6E). In another embodiment, the second conductive region 610 (as shown being formed in FIGS. 6B and 6C) is formed subsequent to forming the isolation trench 614 (as shown being formed in FIG. 6D), subsequent to forming the random or regularized texturing pattern 616 (as shown being formed in FIG. 6E), and subsequent to forming the openings in the dielectric layer 618 (as shown being formed in FIG. 6F).

In another aspect of the present invention, a printing process may be used to fabricate a bypass diode for a solar cell. For example, in an embodiment, ink-jetting of doped silicon nano-particles is used to provide individual cell bypass diode protection. The approach may be applicable to nano-particle solar cells and can be used in the fabrication of various emitters.

As described above, bypass diodes may be used to protect solar cells from the reverse voltage breakdown when they are reversely biased and heated by shading or soiling. In practice, the bypass diodes are usually placed across groups of solar cells since embedding one bypass diode per solar cell has generally proven too expensive to implement. For example, conventionally, adding bypass diodes to a solar cell has been done only to the group of cells to meet the cost requirement in concentrator silicon solar cells or has been done as part of deposition and patterning steps in thin film solar cells. Nonetheless, bypassing shaded cell on an individual basis may be ideal for collecting the maximum short circuit current in a module. Thus, in an embodiment, a practical route to embed a bypass diode to the individual cell without adding additional operations to an ink-jetting doped silicon nano-particle process is provided.

In an embodiment, a printable monolithic bypass diode is provided with a concentrator solar cell in a cost-effective cell/module including a module design with no need for bypass diode soldering. Thus, a new route to add the function of an embedded bypass diode to a back contact silicon solar cell architecture using printable polysilicon emitter technology without adding extra processing steps may be provided. As described in detail below in association with FIG. 7, in an embodiment, during printing of doped silicon nano-particles used to form a polysilicon emitter, a bypass diode area is also printed.

In a printed bypass diode, the $N^+$ and $P^+$ emitters may be printed vertically at the specified region optimized for metallization and minimization of a corresponding dead area. That is, layout consideration may account for the observation that a bypass diode region will be a dead area during the forward bias condition. After printing, a sintering or curing process may be used to melt the silicon emitter to provide a current path. The inter-mixing or diffusion between the vertically stacked $N^+/P^+$ emitter for the bypass diode, however, may be assumed to be minimal. In an embodiment, a resulting vertical PN junction polysilicon diode works as bypass diode for a solar cell and reduces the temperature of hot spots. In one embodiment, a sintering process is applied to sinter or melt the printed emitter to form a continuous structure. In a specific embodiment, any inter-mixing or diffusion between the vertically stacked N+/P+ emitter for the bypass diode is negligible.

Figure 7:
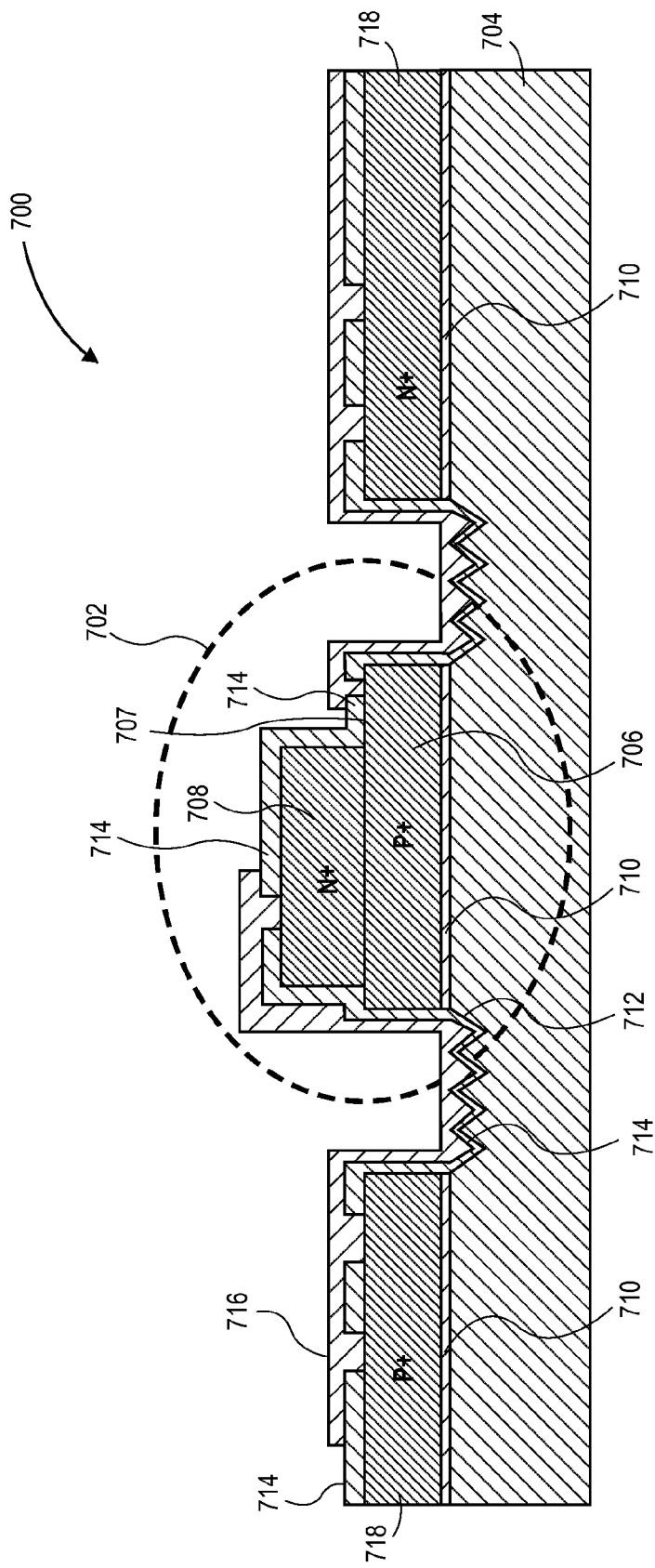
FIG. 7 illustrates a cross-sectional view of a bypass diode formed a printing approach, in accordance with an embodiment of the present invention.

FIG. 7 illustrates a cross-sectional view of a bypass diode formed a printing approach, in accordance with an embodiment of the present invention. The vertical N+/P+ bypass diode (located in the hashed circle 702 of FIG. 7) may be fabricated by using doped silicon (Si) nano-particles or doped organic semiconductors, as described above.

Referring to FIG. 7, a bypass diode 702 for a solar cell 700 includes a substrate 704 of the solar cell 700. A first conductive region 706 of a first conductivity type is disposed above the substrate 704. A second conductive region 708 is disposed on the first conductive region 706. The second conductive region 708 is of a second conductivity type opposite the first conductivity type. In an embodiment, the second conductive region 708 is narrower than the first conductive region 706, exposing a top surface 707 of the first conductive region 706, as depicted in FIG. 7.

In one embodiment, the substrate 704 is doped with N-type dopant impurity atoms, the first conductivity type is P-type, the second conductivity type is N-type, and exposing the top surface of the first conductive region 706 includes exposing a P-type region, as depicted in FIG. 7. However, in an alternative embodiment, the substrate 704 is doped with P-type dopant impurity atoms, the first conductivity type is N-type, the second conductivity type is P-type, and exposing the top surface of the first conductive region 706 includes exposing an N-type region.

In an embodiment, the bypass diode 702 further includes a thin dielectric layer 710 disposed on the substrate 704. The first conductive region 706 is disposed on the thin dielectric layer 710, as depicted in FIG. 7. In one embodiment, the thin dielectric layer 710 is a silicon oxide layer having a thickness approximately in the range of 5-50 Angstroms. In an embodiment, the bypass diode 702 further includes an isolation trench 712 disposed in the substrate 704 and surrounding the portion of the substrate 704 below the first conductive region 706. In one embodiment, the isolation trench 712 is filled with a dielectric layer 714, such as an anti-reflective coating layer, that is disposed on the first and second conductive regions 706 and 708, respectively, as depicted in FIG. 7. In a specific embodiment, the bottom surface of the isolation trench 712 has a random or regularized texturing pattern, as is also depicted in FIG. 7. The random or regularized texturing pattern may be formed by applying an anisotropic etching process to exposed regions of substrate 704 and may thus be determined by crystal planes of the substrate 704. Bypass diode 702 and, hence, solar cell 700 may include other features such a metal contact layer 716. Solar cell 700 may also include features suitable for back contact formation, such as back contacts 718.

Figure 8:
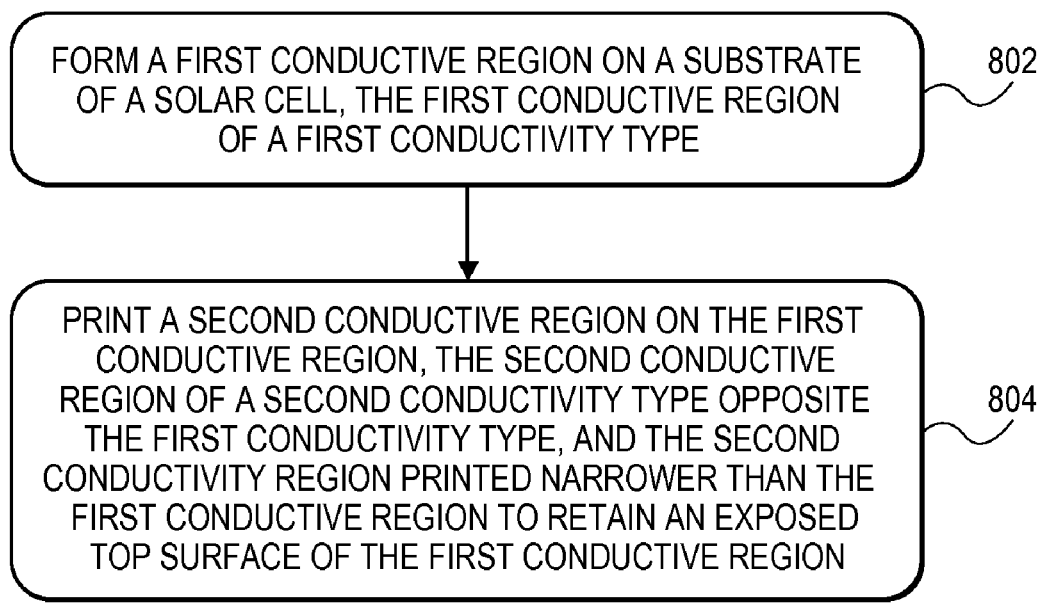
FIG. 8 illustrates a flowchart representing operations in a method of fabricating a bypass diode for a solar cell, in accordance with an embodiment of the present invention.

FIG. 8 illustrates a flowchart 800 representing operations in a method of fabricating a bypass diode for a solar cell, in accordance with an embodiment of the present invention. FIGS. 9A-9E illustrate cross-sectional views of various stages in the fabrication of a solar cell, corresponding to operations of the flowchart of FIG. 8, in accordance with an embodiment of the present invention.

Figure 9A:
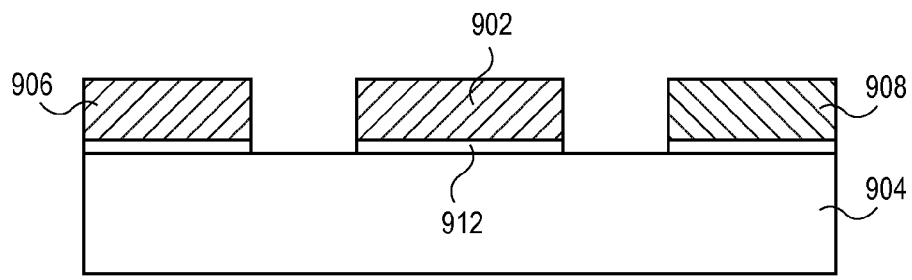
FIG. 9A illustrates a cross-sectional view of a stage in the fabrication of a solar cell, corresponding to operation 802 of the flowchart of FIG. 8, in accordance with an embodiment of the present invention.

Referring to operation 802 of flowchart 800, and to corresponding FIG. 9A, a method of fabricating a bypass diode for a solar cell includes forming a first conductive region 902 on a substrate 904 of the solar cell. In an embodiment, the first conductive region 902 is of a first conductivity type. In an embodiment, forming the first conductive region 902 includes using a material such as, but not limited to, doped nano-particles, a doped amorphous film, or a conductive polymer. As is also depicted in FIG. 9A, other conductive regions, such as regions for back-contact, may also be formed. For example, a region 906 has the first conductivity type, while a region 908 has a second, opposite conductivity type.

Figure 9B:
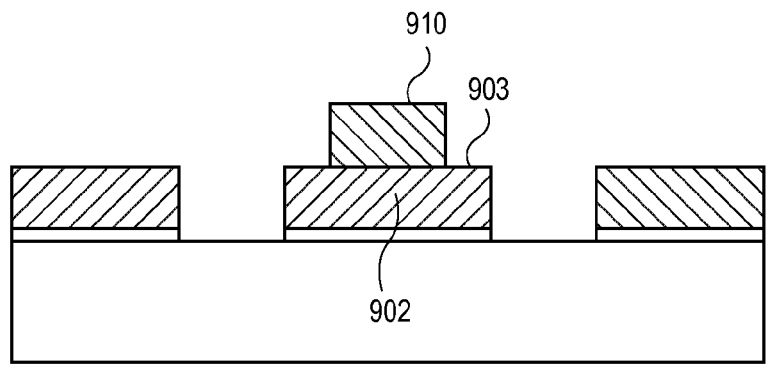
FIG. 9B illustrates a cross-sectional view of a stage in the fabrication of a solar cell, corresponding to operation 804 of the flowchart of FIG. 8, in accordance with an embodiment of the present invention.

Referring to operation 804 of flowchart 800, and to corresponding FIG. 9B, the method of fabricating the bypass diode for the solar cell also includes printing a second conductive region 910 on the first conductive region 902, the second conductive region 910 of a second conductivity type opposite the first conductivity type, and the second conductive region 910 printed narrower than the first conductive region to retain an exposed top surface 903 of the first conductive region 902. In an embodiment, printing the second conductive region 910 on the first conductive region 902 includes using a process such as, but not limited to, an ink jet process, a screen printing process, or an aerosol jetting process. In an embodiment, printing the second conductive region 910 includes using a material such as, but not limited to, doped nano-particles, a doped amorphous film, or a conductive polymer. In an alternative embodiment, the second conductive region 910 is initially printed to have approximately the same width as the first conductive region. Then, at a later processing operation, e.g., through laser ablation at a contact formation operation, the width of the second conductive region 910 is made narrower than the width of the first conductive region, or openings are made, to expose a portion of the top surface 903 of the first conductive region 902.

In an embodiment, the second conductive region 910 is of a second conductivity type opposite the first conductivity type. In one embodiment, the substrate 904 is doped with N-type dopant impurity atoms, the first conductivity type is P-type, and the second conductivity type is N-type. However, in an alternative embodiment, the substrate 904 is doped with P-type dopant impurity atoms, the first conductivity type is N-type, and the second conductivity type is P-type.

In an embodiment, referring again to FIG. 9A, the method further includes, prior to forming the first conductive region 902, forming a thin dielectric layer 912 on the substrate, wherein the first conductive region 902 is formed on the thin dielectric layer 912. In one embodiment, the thin dielectric layer 912 is a silicon oxide layer having a thickness approximately in the range of 5-50 Angstroms.

Figure 9C:
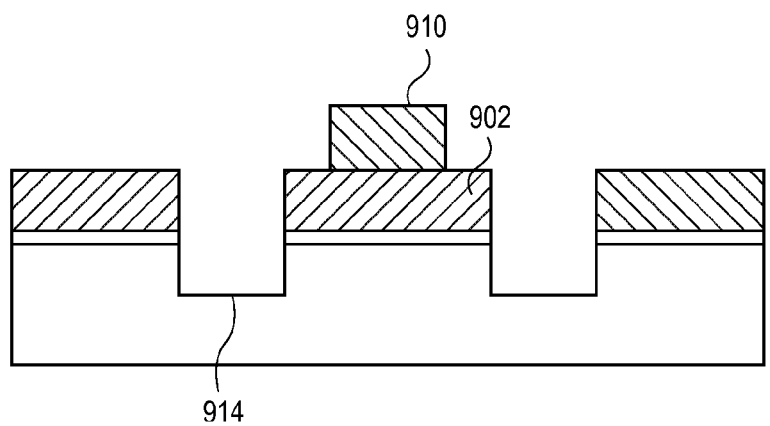
FIG. 9C illustrates a cross-sectional view of a stage in the fabrication of a solar cell, in accordance with an embodiment of the present invention.
Figure 9D:
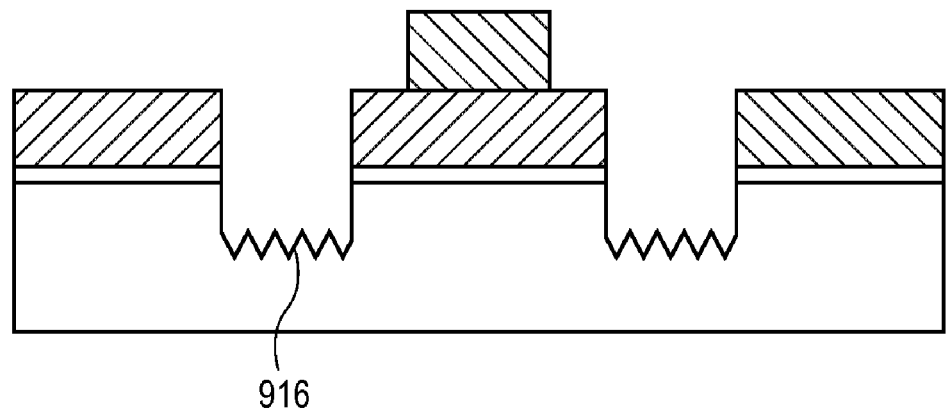
FIG. 9D illustrates a cross-sectional view of a stage in the fabrication of a solar cell, in accordance with an embodiment of the present invention.
Figure 9E:
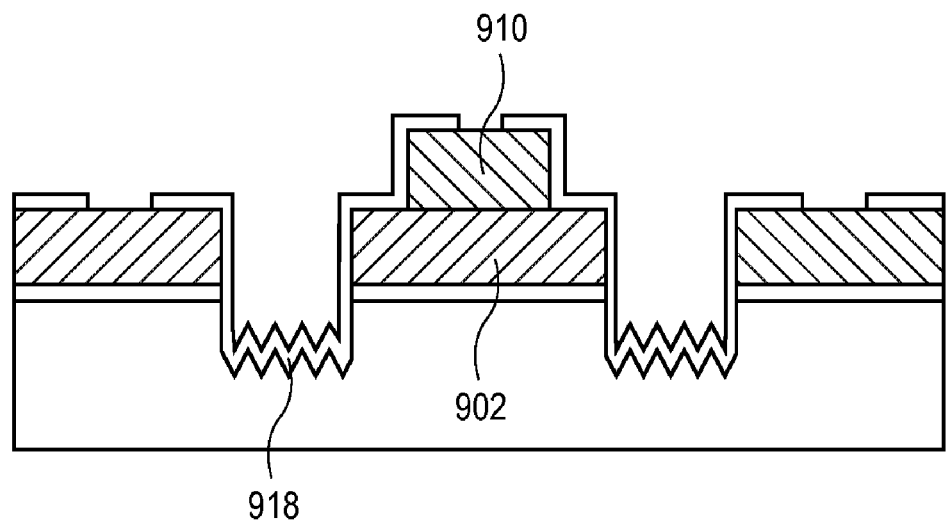
FIG. 9E illustrates a cross-sectional view of a stage in the fabrication of a solar cell, in accordance with an embodiment of the present invention.

In an embodiment, referring to FIG. 9C, the method of fabricating the bypass diode for the solar cell also includes forming an isolation trench 914 in the substrate 904 and surrounding the portion of the substrate 904 below the first conductive region 902. In one embodiment, the method also includes forming a dielectric layer 918 in the isolation trench 914 and on at least a portion of each of the first and second conductive regions 902 and 910, respectively. In a specific embodiment, openings are formed in the dielectric layer 918 for subsequent contact formation, as depicted in FIG. 9E. In another specific embodiment, the method further includes, prior to forming the dielectric layer 918, etching the bottom surface of the isolation trench 914 to provide a random or regularized texturing pattern 916, as depicted in FIG. 9D.

Thus, bypass diodes for solar cells have been disclosed. In accordance with an embodiment of the present invention, a bypass diode for a solar cell includes a substrate of the solar cell. A first conductive region is disposed above the substrate, the first conductive region of a first conductivity type. A second conductive region is disposed on the first conductive region, the second conductive region of a second conductivity type opposite the first conductivity type. In one embodiment, the second conductive region is narrower than the first conductive region, exposing a top surface of the first conductive region. In another embodiment, the second conductive region is disposed within, and surrounded by, an uppermost portion of the first conductive region, but is not disposed in a lowermost portion of the first conductive region.

What is claimed is:
1. A bypass diode for a solar cell, the bypass diode comprising:
 a substrate of the solar cell;
 a first conductive region disposed above the substrate, the first conductive region of a first conductivity type;

and a second conductive region disposed on the first conductive region, the second conductive region of a second conductivity type opposite the first conductivity type; and further comprising:
an isolation trench disposed in the substrate and surrounding the portion of the substrate below the first conductive region, wherein the isolation trench is filled with a dielectric layer that is disposed on the first and second conductive regions.

2. The bypass diode of claim 1, further comprising: a thin dielectric layer disposed on the substrate, wherein the first conductive region is disposed on the thin dielectric layer.

3. The bypass diode of claim 1, wherein the second conductive region is narrower than the first conductive region, exposing a top surface of the first conductive region.

4. The bypass diode of claim 3, wherein the substrate is doped with N-type dopant impurity atoms, the first conductivity type is P-type, the second conductivity type is N-type, and exposing the top surface of the first conductive region comprises exposing a P-type region.

5. The bypass diode of claim 3, wherein the substrate is doped with P-type dopant impurity atoms, the first conductivity type is N-type, the second conductivity type is P-type, and exposing the top surface of the first conductive region comprises exposing an N-type region.

6. The bypass diode of claim 1, wherein the second conductive region is disposed within, and surrounded by, an uppermost portion of the first conductive region, but is not disposed in a lowermost portion of the first conductive region.

7. The bypass diode of claim 6, wherein the substrate is doped with N-type dopant impurity atoms, the first conductivity type is P-type, the second conductivity type is N-type, and the second conductive region is disposed within and surrounded by a P-type region.

8. The bypass diode of claim 6, wherein the substrate is doped with P-type dopant impurity atoms, the first conductivity type is N-type, the second conductivity type is P-type, and the second conductive region is disposed within and surrounded by a N-type region.

9. The bypass diode of claim 1, wherein the bottom surface of the isolation trench comprises a random or regularized texturing pattern.

10. A bypass diode for a solar cell, the bypass diode comprising:
a substrate of the solar cell;
a first conductive region disposed above the substrate, the first conductive region of a first conductivity type;
and a second conductive region disposed on the first conductive region, the second conductive region of a second conductivity type opposite the first conductivity type and further comprising:
a thin dielectric layer disposed on the substrate, wherein the first conductive region is disposed on the thin dielectric layer;
wherein the second conductive region is narrower than the first conductive region, exposing a top surface of the first conductive region.

11. The bypass diode of claim 10, wherein the substrate is doped with N-type dopant impurity atoms, the first conductivity type is P-type, the second conductivity type is N-type, and exposing the top surface of the first conductive region comprises exposing a P-type region.

12. The bypass diode of claim 10, wherein the substrate is doped with P-type dopant impurity atoms, the first conductivity type is N-type, the second conductivity type is P-type, and exposing the top surface of the first conductive region comprises exposing an N-type region.

13. The bypass diode of claim 10, further comprising: an isolation trench disposed in the substrate and surrounding the portion of the substrate below the first conductive region, wherein the isolation trench is filled with a dielectric layer that is disposed on the first and second conductive regions.

14. The bypass diode of claim 13, wherein the bottom surface of the isolation trench comprises a random or regularized texturing pattern.

15. A bypass diode for a solar cell, the bypass diode comprising:
a substrate of the solar cell;
a first conductive region disposed above the substrate, the first conductive region of a first conductivity type;
and a second conductive region disposed on the first conductive region, the second conductive region of a second conductivity type opposite the first conductivity type; and further comprising:
wherein the second conductive region is disposed within, and surrounded by, an uppermost portion of the first conductive region, but is not disposed in a lowermost portion of the first conductive region.

16. The bypass diode of claim 15, further comprising: a thin dielectric layer disposed on the substrate, wherein the first conductive region is disposed on the thin dielectric layer.

17. The bypass diode of claim 15, wherein the substrate is doped with N-type dopant impurity atoms, the first conductivity type is P-type, the second conductivity type is N-type, and the second conductive region is disposed within and surrounded by a P-type region.

18. The bypass diode of claim 15, wherein the substrate is doped with P-type dopant impurity atoms, the first conductivity type is N-type, the second conductivity type is P-type, and the second conductive region is disposed within and surrounded by a N-type region.

* * * * *